(12) United States Patent
Okuno et al.

(10) Patent No.: US 9,837,494 B2
(45) Date of Patent: Dec. 5, 2017

(54) PRODUCTION METHOD FOR GROUP III NITRIDE SEMICONDUCTOR AND GROUP III NITRIDE SEMICONDUCTOR

(71) Applicant: TOYODA GOSEI CO., LTD., Kiyosu-shi (JP)

(72) Inventors: Koji Okuno, Kiyosu (JP); Takahide Oshio, Kiyosu (JP); Naoki Shibata, Kiyosu (JP); Hiroshi Amano, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 603 days.

(21) Appl. No.: 13/845,453

(22) Filed: Mar. 18, 2013

(65) Prior Publication Data
US 2013/0256743 A1 Oct. 3, 2013

(30) Foreign Application Priority Data

Mar. 30, 2012 (JP) .................................. 2012-82948

(51) Int. Cl.
*H01L 21/02* (2006.01)
*C30B 25/02* (2006.01)
(Continued)

(52) U.S. Cl.
CPC ...... *H01L 29/2003* (2013.01); *H01L 21/0254* (2013.01); *H01L 21/02609* (2013.01);
(Continued)

(58) Field of Classification Search
CPC ......... H01L 43/12; H01L 43/10; H01L 27/22; H01L 43/08; H01L 21/0262;
(Continued)

(56) References Cited

U.S. PATENT DOCUMENTS 5,587,593 A * 12/1996 Koide .................. H01L 33/325
257/103
8,367,445 B2 2/2013 Okuno
(Continued)

FOREIGN PATENT DOCUMENTS

JP 2000-106455 A 4/2000
JP 2003-526907 A 9/2003
(Continued)

OTHER PUBLICATIONS

U.S. Office Action dated Mar. 17, 2015 in co-pending U.S. Appl. No. 14/290,684.
(Continued)

*Primary Examiner* — Mary Wilczewski
*Assistant Examiner* — Tsz Chiu
(74) *Attorney, Agent, or Firm* — McGinn IP Law Group, PLLC

(57) ABSTRACT

A method for producing a Group III nitride semiconductor comprising forming mesas on a main surface of a substrate, and growing Group III nitride semiconductor in a c-axis direction thereof, wherein the plane most parallel to the side surfaces of the mesas or the dents among the low-index planes of growing Group III nitride semiconductor is a m-plane (1-100), and when a projected vector obtained by orthogonally projecting a normal vector of the processed side surface to the main surface is defined as a lateral vector, an angle between the lateral vector and a projected vector obtained by orthogonally projecting a normal vector of the m-plane of the growing Group III nitride semiconductor to the main surface is 0.5° or more and 6° or less.

34 Claims, 12 Drawing Sheets

(51) Int. Cl.
  *H01L 29/20* (2006.01)
  *H01L 33/32* (2010.01)
  *H01L 29/04* (2006.01)
  *H01L 33/00* (2010.01)
  *H01L 33/16* (2010.01)

(52) U.S. Cl.
  CPC ............ *H01L 29/04* (2013.01); *H01L 33/007* (2013.01); *H01L 33/16* (2013.01); *H01L 33/32* (2013.01)

(58) Field of Classification Search
  CPC ............. H01L 21/268; H01L 21/67115; H01L 31/03046; H01L 31/035227; H01L 31/0725; H01L 31/0735
  USPC .............................. 117/952, 90, 94, 95, 106
  See application file for complete search history.

(56) References Cited

U.S. PATENT DOCUMENTS

| | | | |
|---|---|---|---|
| 8,680,581 B2 | 3/2014 | Nakada et al. | |
| 8,795,440 B2* | 8/2014 | Imer | C30B 25/02 148/33.4 |
| 2003/0057444 A1 | 3/2003 | Niki et al. | |
| 2003/0119239 A1* | 6/2003 | Koike | H01L 33/007 438/200 |
| 2003/0145783 A1* | 8/2003 | Motoki et al. | 117/89 |
| 2004/0020642 A1* | 2/2004 | Vinegar et al. | 166/245 |
| 2004/0048448 A1* | 3/2004 | Koike | H01L 21/0237 438/459 |
| 2005/0001227 A1 | 1/2005 | Niki et al. | |
| 2005/0179130 A1 | 8/2005 | Tanaka et al. | |
| 2006/0073680 A1* | 4/2006 | Han | B82Y 10/00 438/479 |
| 2008/0223286 A1* | 9/2008 | Nagai | C30B 9/00 117/88 |
| 2008/0271665 A1* | 11/2008 | Yamazaki | C30B 9/00 117/13 |
| 2008/0303043 A1 | 12/2008 | Niki et al. | |
| 2009/0042328 A1 | 2/2009 | Niki et al. | |
| 2009/0197118 A1* | 8/2009 | Nagai et al. | 428/698 |
| 2010/0197055 A1 | 8/2010 | Tanaka et al. | |
| 2010/0264445 A1 | 10/2010 | Niki et al. | |
| 2010/0264446 A1 | 10/2010 | Niki et al. | |
| 2010/0264447 A1 | 10/2010 | Niki et al. | |
| 2010/0266815 A1 | 10/2010 | Niki et al. | |
| 2010/0267181 A1 | 10/2010 | Niki et al. | |
| 2011/0240956 A1* | 10/2011 | Saito | H01L 33/02 257/13 |
| 2011/0244610 A1* | 10/2011 | Saito | H01L 33/007 438/29 |
| 2012/0009768 A1* | 1/2012 | Tadatomo | C30B 25/18 438/479 |
| 2012/0135557 A1* | 5/2012 | Okuno | H01L 21/0242 438/39 |
| 2014/0353804 A1 | 12/2014 | Okuno et al. | |
| 2015/0349203 A1* | 12/2015 | Shimooka | H01L 33/32 257/13 |

FOREIGN PATENT DOCUMENTS

| | | |
|---|---|---|
| JP | 2003/318441 A | 11/2003 |
| JP | 2004-200523 A | 7/2004 |
| JP | 2005-101566 A | 4/2005 |
| JP | 2010-168274 A | 8/2010 |
| JP | 2011-77265 A | 4/2011 |
| JP | 2011-077265 A | 4/2011 |
| JP | 2012-114204 A | 6/2012 |
| WO | WO01/59819 A1 | 8/2001 |

OTHER PUBLICATIONS

Japanese Office Action dated Jan. 20, 2015 with a partial English translation thereof.

* cited by examiner a 0° b Approx. 1.5° c Approx. 3° d Approx. 7°

PRODUCTION METHOD FOR GROUP III NITRIDE SEMICONDUCTOR AND GROUP III NITRIDE SEMICONDUCTOR

BACKGROUND OF THE INVENTION

Field of the Invention

The present invention relates to a method for growing Group III nitride semiconductor crystal on a mesa-formed substrate and a Group III nitride semiconductor.

Background Art

When a Group III nitride semiconductor light-emitting device is produced by crystal growth of Group III nitride semiconductor on a sapphire substrate, a technique has been developed to form mesas on a Group III nitride semiconductor growing surface of the sapphire substrate to improve the light extraction performance (e.g. Japanese Patent Application Laid-Open (kokai) Nos. 2004-200523 and 2005-101566).

Japanese Patent Application Laid-Open (kokai) No. 2003-526907 discloses that a mesa stripe pattern is formed on a sapphire substrate, a GaN is vertically grown on the top surface of the mesa, and further laterally grown, thereby obtaining a GaN semiconductor having a low threading dislocation density.

However, when Group III nitride semiconductor is grown on the mesa-formed sapphire substrate by these methods, voids are formed on side surfaces of the dents or mesas, resulting in a problem that crystallinity and flatness of Group III nitride semiconductor are deteriorated.

Therefore, Japanese Patent Application Laid-Open (kokai) No. 2003-318441 discloses that sides in planar view of dents or mesas intersect with an a-plane of the sapphire substrate. When the dents or mesas are formed in such a manner, GaN is grown on the top surfaces of the mesas of the sapphire substrate and the bottom surfaces of the dents, and GaN is difficult to grow on side surfaces of the mesas or dents. As the growth progresses, the crystals are combined together, thereby obtaining GaN having superior crystallinity and high flatness, with no void formed therein. On the other hand, when the sides in planar view of the dents or mesas are parallel to the a-plane of the sapphire substrate, lateral growth of the GaN grown on the dents or mesas is slow. Therefore, a space near the side surfaces of the dents or mesas is difficult to be buried with GaN, and the surface flatness of GaN is deteriorated.

Japanese Patent Application Laid-Open (kokai) No. 2011-77265 discloses that all side surfaces of mesas on a substrate having an a-plane or c-plane main surface are the surfaces which inhibit the crystal growth of Group III nitride semiconductor. It is also disclosed that when the mesas are hexagonal prisms, the angle between each side of hexagons in planar view and the m-axis is 15°.

When the Group III nitride semiconductor is grown in a direction perpendicular to the main surface from the top surfaces of the mesas and the bottom surfaces of the dents, there is an advantage that the threading dislocation density is reduced on the most upper surface of the grown semiconductor because the threading dislocation is bent laterally through the facet growth. However, there is a disadvantage that the threading dislocation density is uneven on the upper surface of the grown semiconductor layer because the laterally bent threading dislocation is concentrated in the vicinity of a boundary between the dents and the mesas.

When the Group III nitride semiconductor is vertically grown on the top surfaces of the mesas and the bottom surfaces of the dents on the mesa-formed substrate, steps need to be buried by laterally growing the Group III nitride semiconductor. That is, after the Group III nitride semiconductor was grown under the growth conditions where growth is faster in a direction perpendicular to the main surface of the substrate, it is necessary to grow the Group III nitride semiconductor under the growth conditions where growth is faster in a lateral direction. Therefore, there is a problem that the production method is complicated.

SUMMARY OF THE INVENTION

In view of the foregoing, an object of the present invention is to establish a method for producing a Group III nitride semiconductor having good crystallinity with steps thereof buried without changing the growth conditions. It is also to make the threading dislocation density uniform and even on the top surface of the grown semiconductor layer.

In a first aspect of the present invention, there is provided a method for producing a Group III nitride semiconductor comprising forming mesas on a main surface of a substrate, and growing Group III nitride semiconductor in a c-axis direction of Group III nitride semiconductor on the top surfaces of the mesas and the bottom surfaces of the dents, wherein side surfaces of the mesas and the dents are formed so as to satisfy the following conditions:

a plane, which is most parallel to the side surfaces among low-index planes of the growing Group III nitride semiconductor, is a m-plane (1-100); and when a projected vector obtained by orthogonally projecting a normal vector of the side surface to the main surface is defined as a lateral vector, an angle formed by the lateral vector and a projected vector obtained by orthogonally projecting a normal vector of the m-plane of the growing Group III nitride semiconductor to the main surface is 0.5° or more and 6° or less.

The above angle is defined as a smaller angle of the angles formed by two intersecting vectors. The substrate may be material having any crystal structure as long as the Group III nitride semiconductor is grown in the c-axis of Group III nitride semiconductor on the top surfaces of the mesas and the bottom surfaces of the dents. For example, a substrate formed of at least one of a group consisting of sapphire, SiC, Si, and ZnO, Group III nitride semiconductor substrate such as GaN, AlN substrate or a template substrate in which an epitaxial layer of Group III nitride semiconductor such as GaN is formed on a substrate made of any material, may be used. When the template substrate is used, mesas may be formed only on the epitaxial layer or so as to extend from the epitaxial layer to the substrate. The processed side surfaces of the mesas or dents may be perpendicular to the main surface of the substrate, but there may be an inclination caused by etching or an intentional inclination. Moreover, each processed side surface may comprise a curved plane formed by arranging a plurality of planes, each of which has different normal vector, in a vertical direction. The side surface may comprise a curved surface whose vertical cross section is arc-shaped, ellipse-shaped, parabola-shaped, or other curve-shaped. The side surface that can be considered as one plane is not necessarily a straight line along a direction parallel to the main surface of the substrate. One planar side surface may be a curve or inflected line.

In the present invention, a projected vector obtained by orthogonally projecting a normal vector of the side surface to the main surface is defined as a lateral vector, considering the case where the side surface of the mesa is not perpendicular to the main surface. That is, an inclination angle of the side surface from the surface perpendicular to the main surface is not included in the angle disclosed in the present invention. A c-axis of Group III nitride semiconductor growing in a direction perpendicular to the main surface on the top surfaces of the mesas and the bottom surfaces of the dents is basically perpendicular to the main surface, but may be slightly inclined. A m-plane terrace and an a-plane step are formed on the side surfaces of the growing Group III nitride semiconductor. The m-plane (1-100) of Group III nitride semiconductor is perpendicular to the a-plane (11-20). The growth of Group III nitride semiconductor is slow in the m-axis direction and fast in the a-axis direction. When one planar processed side surface is not a single plane, the normal vector on one processed side surface is defined as an average of normal vectors. That is, an average of normal vector surface integrals is defined as a normal vector of one side surface.

The present invention is characterized by that the orientation of the processed side surface is determined so that then angle between the lateral vector obtained by orthogonally projecting a normal vector of the side surface to the main surface and the projected obtained by orthogonally projecting the normal vector of the m-plane of the growing Group III nitride semiconductor to the main surface falls within a range of 0.5° to 6°. When the side surface of Group III nitride semiconductor growing in the c-axis direction perpendicular to the main surface of the substrate on the top surfaces of the mesas and the bottom surfaces of the dents is the m-plane, Group III nitride semiconductor is facet grown so as to have a triangle cross section. Threading dislocation is bent laterally through facet growth, and the threading dislocation density is reduced on the upper surface of the grown semiconductor layer. However, unless Group III nitride semiconductor is also grown in a direction parallel to the main surface, a space among the facets cannot be buried with Group III nitride semiconductor.

In the present invention, a surface in the growing Group III nitride semiconductor, which is perpendicular to the lateral vector of the processed side surface (also perpendicular to the main surface), is rotated within a range of 0.5° to 6° from the m-plane of the Group III nitride semiconductor around an axis perpendicular to the substrate. If the c-axis is completely perpendicular to the main surface, the side surface of Group III nitride semiconductor (perpendicular to the main surface) is a plane formed by rotating the m-plane within a range of 0.5° to 6° around the c-axis. Here, the range is satisfied in the both direction of a clockwise and a counterclockwise. Therefore, the projected vector obtained by orthogonally projecting the normal vector of the a-plane of the growing Group III nitride semiconductor (the a-plane is perpendicular to the m-plane and parallel to the c-axis) to the main surface has a component in a direction of the lateral vector. As a result, Group III nitride semiconductor grows in a direction parallel to the main surface and perpendicularly to the processed side surface. Thus, lateral growth parallel to the main surface is achieved in addition to vertical growth in the c-axis direction, thereby burying the steps caused by mesa forming without changing the vertical growth conditions. With such a growth method, a high density of threading dislocation is suppressed from being concentrated in the vicinity of a boundary between the dents and the mesas, and the threading dislocation density can be even and uniform on the most upper surface of the growing semiconductor layer. The present invention is based on the above idea.

In the above invention, when a substrate with a hexagonal crystal structure is used, the following embodiments are given. The main surface of the substrate is a c-plane of hexagonal crystal, and an angle between the lateral vector of the processed side surface and a projected vector obtained by orthogonally projecting a normal vector of a-plane (11-20) of hexagonal crystal to the main surface can be 0.5° or more and 6° or less. In this case, the a-plane of hexagonal crystal in the substrate is parallel to the m-plane of the growing Group III nitride semiconductor. Therefore, the angle between the lateral vector of the processed side surface and the projected vector obtained by orthogonally projecting the normal vector of the m-plane of the growing Group III nitride semiconductor to the main surface can be 0.5° or more and 6° or less. That is, a plane of Group III nitride semiconductor, which plain is perpendicular to the lateral vector of the processed side surface, is a plane formed by rotating the m-plane of Group III nitride semiconductor within a range of 0.5° to 6° around the c-axis. Here, the range is satisfied in the both direction of a clockwise and a counterclockwise. Such a relationship between the crystal orientation of the substrate and the crystal orientation of the growing Group III nitride semiconductor is established for the hexagonal crystal substrate having a different lattice constant from that of Group III nitride semiconductor. A representative example of such hexagonal crystal substrate is a sapphire substrate. A SiC substrate and a ZnO substrate also satisfy this relationship.

The main surface of the substrate may be an a-plane of hexagonal crystal. An angle between the lateral vector and a projected vector obtained by orthogonally projecting a normal vector of c-plane (0001) of hexagonal crystal of the substrate to the main surface can be 0.5° or more and 6° or less. In this case, since the m-plane of hexagonal crystal of the substrate is parallel to the a-plane of Group III nitride semiconductor, the c-plane of hexagonal crystal of the substrate is parallel to the m-plane of Group III nitride semiconductor. Therefore, the angle between the lateral vector of the processed side surface and a projected vector obtained by orthogonally projecting a normal vector of the m-plane of the growing Group III nitride semiconductor to the main surface can be 0.5° or more and 6° or less. That is, a plane of Group III nitride semiconductor, which plain is perpendicular to the lateral vector, can be formed by rotating the m-plane of Group III nitride semiconductor within a range of 0.5° to 6° around the c-axis. Here, the range is satisfied in the both direction of a clockwise and a counterclockwise. Such a relationship between the crystal orientation of the substrate and the crystal orientation of the growing Group III nitride semiconductor is established for the substrate with the hexagonal crystal structure having a different lattice constant from that of Group III nitride semiconductor. A representative example of such hexagonal crystal substrate is a sapphire substrate. A SiC substrate and a ZnO substrate also satisfy this relationship.

A substrate in which at least a portion to be mesa-formed of the main surface of the substrate comprises Group III nitride semiconductor may be used. That is, the case where the surface of Group III nitride semiconductor substrate is mesa-formed or the case where the Group III nitride semiconductor layer is mesa-formed in the template substrate in which the Group III nitride semiconductor layer is formed on the substrate is as follows. When the main surface of the substrate is a c-plane of Group III nitride semiconductor, Group III nitride semiconductor is grown in a c-axis direction on the top surfaces of the mesas and the bottom surfaces of the dents. The m-plane of Group III nitride semiconductor of the substrate is parallel to (coincides with) the m-plane of the growing Group III nitride semiconductor. Therefore, the angle between the lateral vector of the side surface and the projected vector obtained by orthogonally projecting the normal vector of the m-plane of Group III nitride semiconductor of the substrate to the main surface may be 0.5° ore mot and 6° or less.

In the above invention, the mesas or dents preferably have a periodic structure where a stripe extending in a first direction on the main surface is repeated in a second direction perpendicular to the first direction. When a substrate with a hexagonal crystal structure is used and its main surface is a c-plane, each dent or mesa may have a shape of regular triangular prism, rhombic prism, regular hexagonal prism, or regular triangular pyramid having a relationship where adjacent side surfaces are intersected at 60°. A plurality of mesas or dents may be arranged at regular intervals in a honeycomb pattern. That is, it is not limited to a parallel stripe pattern where a plurality of processed side surfaces are parallel each other. In other words, as long as the orientation of each planar processed side surface satisfies the above conditions, the mesas or dents have any shape on a plane parallel to the main surface. Although the mesas or dents do not necessarily have a periodicity, uniform crystallinity can be achieved by introducing a periodicity.

The angle between the lateral vector and one of the following projected vectors is preferably 1° or more and 5° or less. More preferably, the angle is 1° or more and 2.5° or less. The projected vector is obtained by orthogonally projecting the normal vector of the m-plane of the growing Group III nitride semiconductor to the main surface; the normal vector of the a-plane of the substrate to the main surface (when the substrate with the hexagonal crystal structure such as sapphire substrate having a c-plane main surface is used); the normal vector of the c-plane of the substrate to the main surface (when the substrate with the hexagonal crystal structure having an a-plane main surface is used); and the normal vector of the m-plane of Group III nitride semiconductor to the main surface (when the substrate in which at least a portion to be mesa-formed is Group III nitride semiconductor is used).

Moreover, in the above invention, preferably a buffer layer is formed on the mesa-formed substrate, and thereafter, Group III nitride semiconductor is grown. The buffer layer is preferably formed by the sputtering method. The buffer layer may be formed by MBE (Molecular Beam Epitaxy) or PLD (Pulse laser deposition or laser abrasion)

A second aspect of the present invention provides a Group III nitride semiconductor having a substrate having a mesa-formed main surface, and grown in a c-axis direction of the Group III nitride semiconductor on the top surfaces of the mesas and the bottom surfaces of the dents, wherein side surfaces of the mesas and the dents are formed so as to satisfy the following conditions:

a plane, which is most parallel to the side surfaces among low-index planes of the growing Group III nitride semiconductor, is a m-plane (1-100); and when a projected vector obtained by orthogonally projecting a normal vector of the side surface to the main surface is defined as a lateral vector, an angle formed by the lateral vector and a projected vector obtained by orthogonally projecting a normal vector of the m-plane of the growing Group III nitride semiconductor to the main surface is 0.5° or more and 6° or less.

The present invention is related to Group III nitride semiconductor grown on a mesa-formed substrate and has a feature of the crystal orientation of the processed side surface, i.e., the side surface of the mesa or the dent, and the crystal orientation of Group III nitride semiconductor grown on a mesa-formed substrate. The main surface of the substrate is a c-plane of hexagonal crystal (e.g., sapphire), and the angle between the lateral vector and the projected vector obtained by orthogonally projecting the normal vector of the a-plane (11-20) of hexagonal crystal of the substrate to the main surface can be 0.5° or more and 6° or less. In this case, since the a-plane of hexagonal crystal of the substrate is parallel to the m-plane of the growing Group III nitride semiconductor, the angle between the lateral vector and the projected vector obtained by orthogonally projecting the normal vector of the m-plane of the growing Group III nitride semiconductor to the main surface can be 0.5° or more and 6° or less.

Moreover, the main surface of the substrate is an a-plane of hexagonal crystal (e.g., sapphire), and the angle between the lateral vector and the projected vector obtained by orthogonally projecting the normal vector of the c-plane (0001) of hexagonal crystal of the substrate to the main surface can be 0.5° or more and 6° or less. In this case, since the c-plane of hexagonal crystal of the substrate is parallel to the m-plane of the growing Group III nitride semiconductor, the angle between the lateral vector and the projected vector obtained by orthogonally projecting the normal vector of the m-plane of the growing Group III nitride semiconductor to the main surface can be 0.5° or more and 6° or less.

When the substrate in which at least the mesa-formed portion of the main surface of the substrate comprises Group III nitride semiconductor is used, and the main surface of the substrate is a c-plane (0001) of Group III nitride semiconductor of the substrate, an angle between the lateral vector and the projected vector obtained by orthogonally projecting the normal vector of the m-plane (1-100) of Group III nitride semiconductor of the substrate to the main surface can be 0.5° or more and 6° or less.

As in the first aspect of the present invention, the mesas may be formed in a plurality of parallel stripes, or in an island-like shape of regular triangular prism, rhombic prism, regular hexagonal prism, regular triangular pyramid, or rhombic pyramid, or regular hexagonal pyramid. Such shaped islands may be arranged at regular intervals in a honeycomb pattern. The angle is preferably 1° or more and 5° or less, more preferably 1° or more and 2.5° or less.

A third aspect of the present invention provides a light-emitting device having a Group III nitride semiconductor according to the second aspect of the present invention. The threading dislocations are formed evenly and uniformly on the grown semiconductor layer, thereby uniforming characteristic of light-emitting device. This also improves the yield ratio of production.

As used herein, "Group III nitride semiconductor" encompasses a semiconductor represented by the formula $Al_xGa_yIn_zN$ ($x+y+z=1$, $0 \le x, y, z \le 1$); such a semiconductor in which a portion of Al, Ga, or In is substituted by another Group 13 element (Group 3B element) (i.e., B or Tl), or a portion of N is substituted by another Group 15 element (Group 5B element) (i.e., P, As, Sb, or Bi). Specific examples of the Group III nitride semiconductor include those containing at least Ga, such as GaN, InGaN, AlGaN, and AlGaInN. Generally, Si is used as an n-type impurity, and Mg is used as a p-type impurity.

According to the first aspect, when the Group III nitride semiconductor is vertically grown in the c-axis direction on the top surfaces of the mesas and the bottom surfaces of the dents on the mesa-formed substrate, the normal vector of the a-plane of the growing Group III nitride semiconductor has a component perpendicular to the processed side surface and parallel to the main surface. Since the crystal growth is faster in the a-axis direction than in the m-axis direction, the Group III nitride semiconductor is also grown in the direction parallel to the main surface of the substrate. As a result, Group III nitride semiconductor is laterally grown as well as facet grown in the direction perpendicular to the main surface under the vertical growth conditions, thereby burying a space among the facets. Thus, the threading dislocation density can be reduced on the upper surface of the grown semiconductor because threading dislocation is bent laterally through facet growth. A high density of threading dislocation is not concentrated in the vicinity of a boundary between the dents or the mesas, and even and uniform threading dislocation density can be achieved on the surface of the semiconductor.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
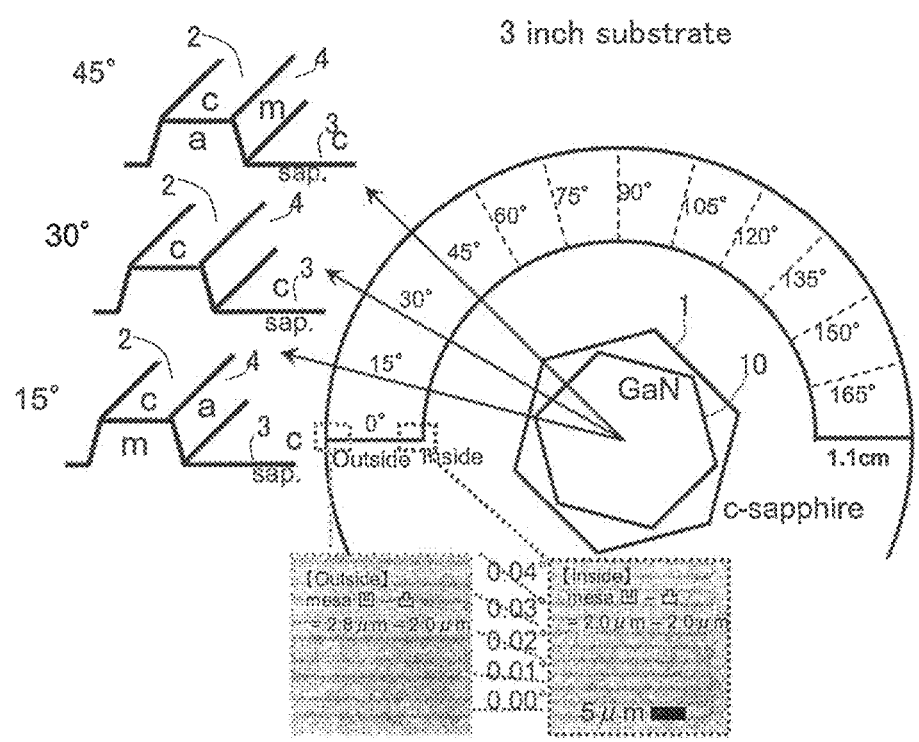
FIG. 1 is a graphical illustration showing a relationship between the processed side surface and the stripe direction in the method for growing GaN by forming mesas and dents on with their stripe direction sequentially and continuously changed on a main surface of the sapphire substrate having a c-plane main surface in Embodiment 1.

GaN crystals were grown on a sapphire substrate having a thickness of 500 μm and a c-plane main surface on which processed side surfaces are formed in different crystal orientations. In FIG. 1, 1 indicates a crystal structure of sapphire, and 10 indicates a crystal structure of the growing GaN. As shown in FIG. 1, mesas 2 and dents 3 were radially formed in a stripe pattern on the main surface of the sapphire substrate. The mesas 2 and the dents 3 were formed by forming the dents 3 through dry etching. An interval angle of adjacent mesas 2 is 0.01°. Each of the dents 3 has a depth of 0.7 μm. Each of the dents 3 has a width of 2.0 μm, and each of the mesas 2 has a width of 2.0 μm. After the processed substrate was placed in a MOCVD growth apparatus and cleaned with a hydrogen gas, an AlN low-temperature buffer layer was formed. Thereafter, GaN was grown under the conditions for vertical growth.

In FIG. 1, when a stripe of mesa 2 is formed in a direction of 15° from the sapphire substrate baseline defined as 0°, the side surface 4 of the mesa 2 is the a-plane of sapphire, and the stripe direction is the m-axis of sapphire. The side surface 4 of the mesa 2 is not accurately perpendicular to the main surface of the substrate, and thus the side surface 4 is not exactly the a-plane. However, a lateral vector defined by orthogonally projecting a normal vector of the side surface 4 to the main surface of the substrate, is the normal vector of the sapphire a-plane. The characteristic of the present invention is the orientation of this lateral vector. It does not matter that the side surface 4 is inclined to the surface perpendicular to the main surface of the substrate. Therefore, hereinafter the side surface is considered perpendicular to the main surface of the substrate for ease of explanation.

At this time, the side surface of the growing GaN, that is, a surface perpendicular to the lateral vector of the side surface 4 of the mesa 2 on the sapphire substrate is a m-plane of GaN. Moreover, when a stripe of mesa 2 is formed in a direction of 45°, the side surface 4 of the mesa 2 is the m-plane of sapphire, and the stripe direction is an a-axis of sapphire. At this time, the side surface of the growing GaN, that is, a surface perpendicular to the lateral vector of the mesa 2 on the sapphire substrate is the a-plane of GaN. When a stripe of mesa 2 is formed in a direction of 30°, the side surface 4 of the mesa 2 is an intermediate surface between the a-plane and the m-plane of sapphire, and the stripe direction is an intermediate direction between the m-axis and the a-axis of sapphire. A surface perpendicular to the lateral vector of the mesa 2 is an intermediate surface between the m-plane and the a-plane of GaN.

Figure 3A:
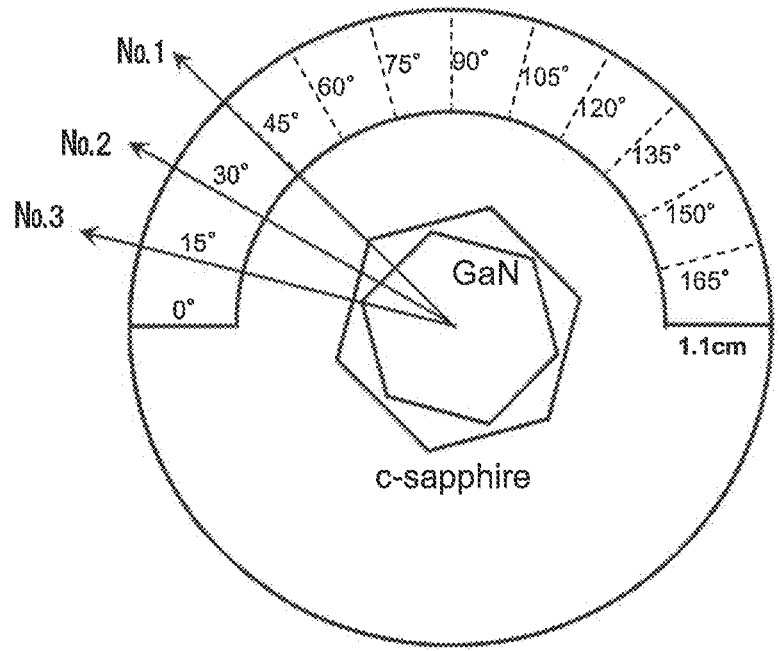
FIG. 3A is a graphical illustration showing a relationship between the stripe direction and the sample in Embodiment 1.
Figure 4:
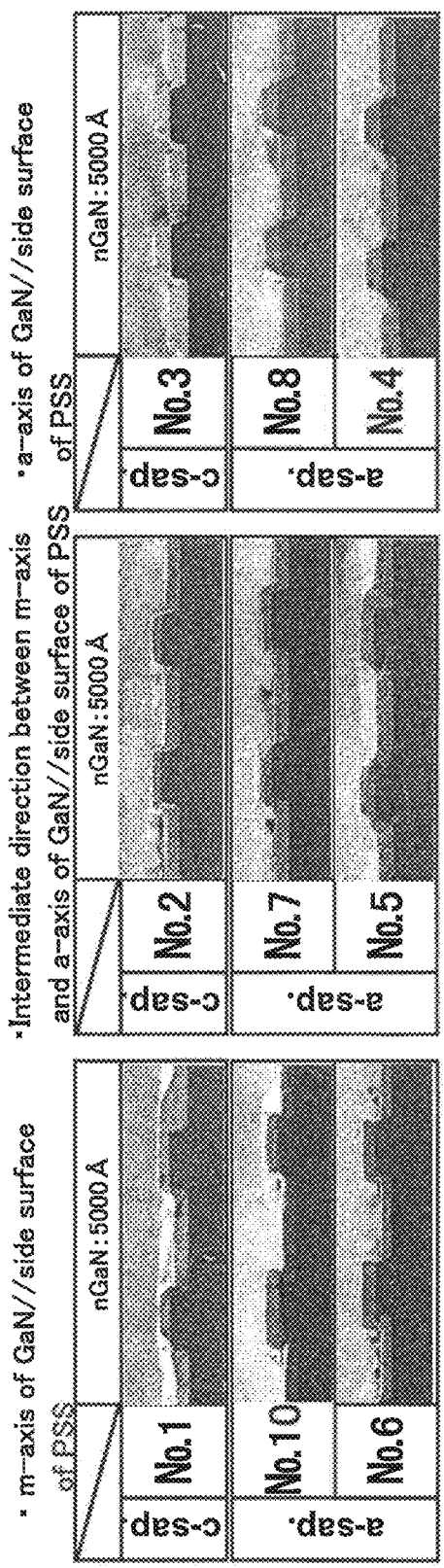
FIG. 4 shows SEM images of the cross sections at an initial stage of GaN growth by the production method according to Embodiments 1 and 2.
Figure 5:
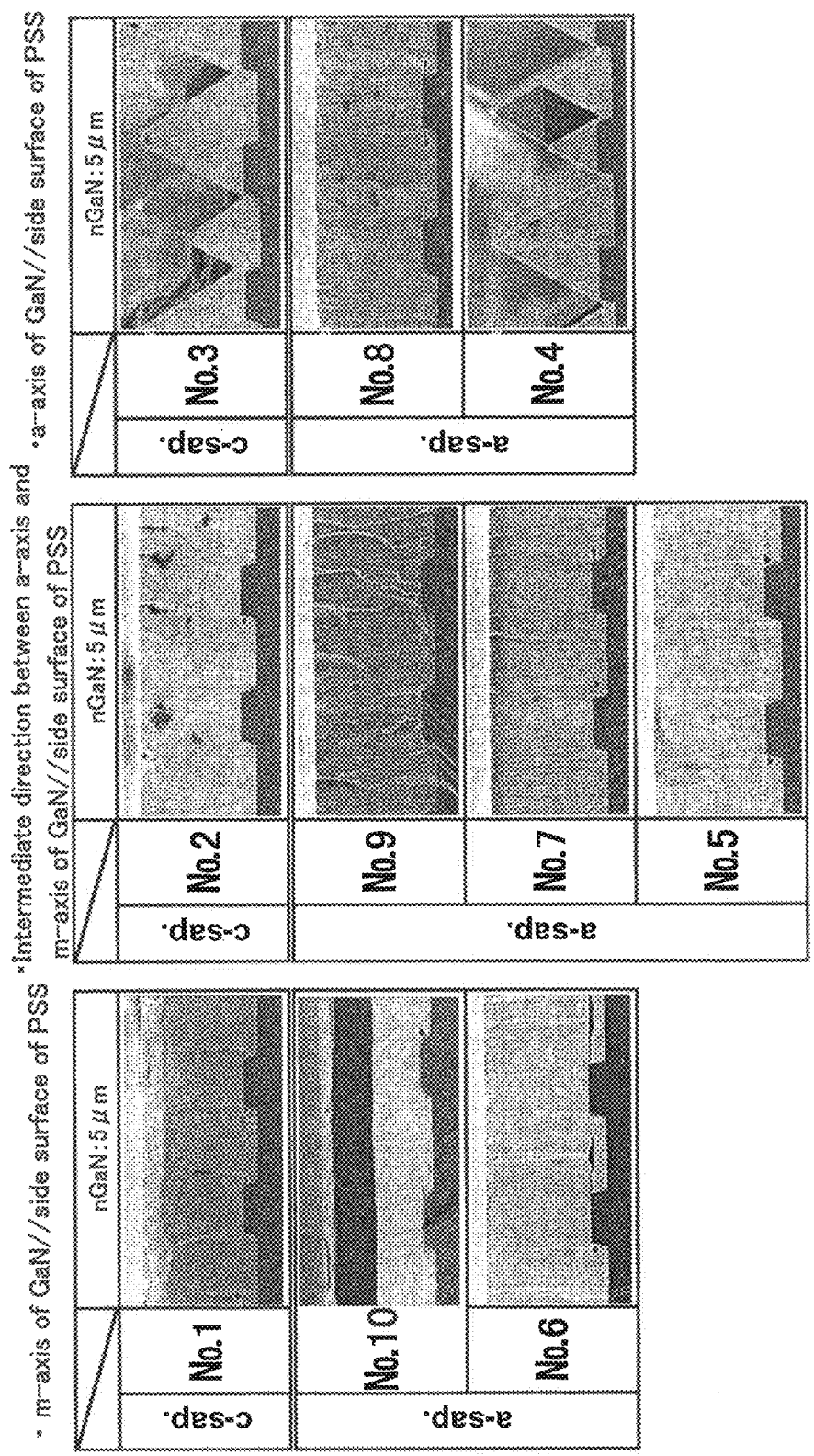
FIG. 5 shows SEM images of the cross sections when a thick film of GaN is formed by the production method according to Embodiments 1 and 2.

As shown in FIG. 3A, the mesa stripe direction is in a direction of 45° to the baseline of the sapphire substrate in the case of No. 1, the mesa stripe direction is in a direction of 30° to the baseline of the sapphire substrate in the case of No. 2, and the mesa stripe direction is in a direction of 15° to the baseline of the sapphire substrate in the case of No. 3. FIG. 4 shows the SEM images of the cross sections perpendicular to the stripe direction when GaN was grown to a thickness of 5000 Å at an initial stage of GaN growth for the cases of No. 1, No. 2 and No. 3. Moreover, FIG. 5 shows SEM images of the cross sections perpendicular to the stripe direction when GaN was grown to a thickness of 5 In the cases of No. 1 and No. 2 of FIG. 4, GaN growth is hardly observed on the side surfaces of the mesas. In the case of No. 3, that is, when the stripe direction is the m-axis of sapphire, the side surface of the mesa is the a-plane, and the surface perpendicular to the lateral vector is the m-plane of GaN, GaN growth is observed on the side surfaces of the mesas. It is also obvious that growing GaN is facet grown on the top surfaces of the mesas and the bottom surfaces of the dents. As is clear from FIG. 5, in the case of No. 1, that is, when the stripe direction is the a-axis of sapphire, the side surface of the mesa is the m-plane, and the surface perpendicular to the lateral vector is the a-plane of GaN, GaN is not facet grown but is vertically grown to be a uniform thickness on the main surface of the substrate. Therefore, the threading dislocation density is high in a vertical direction. On the contrary, in the case of No. 3, GaN is facet grown so that the cross section perpendicular to the stripe direction is triangle-shaped. A space among the facets is not buried with GaN. In the case of No. 2, no GaN facet growth is observed. The density of the threading dislocation extending in a vertical direction is high.

Figure 7A:
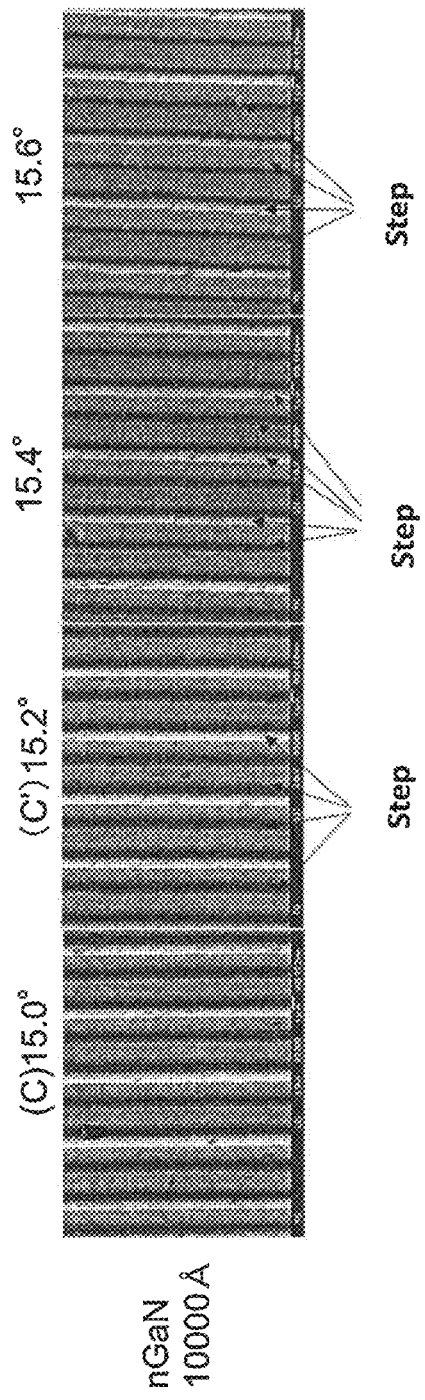
FIG. 7A is SEM images of the surface of GaN grown by the production method according to Embodiment 1.
Figure 7B:
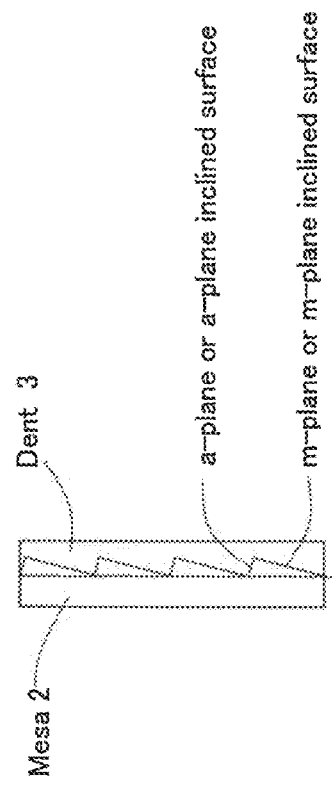
FIG. 7B is graphical illustration showing crystal surfaces of the side surface of GaN grown according to Embodiment 1.
Figure 10A:
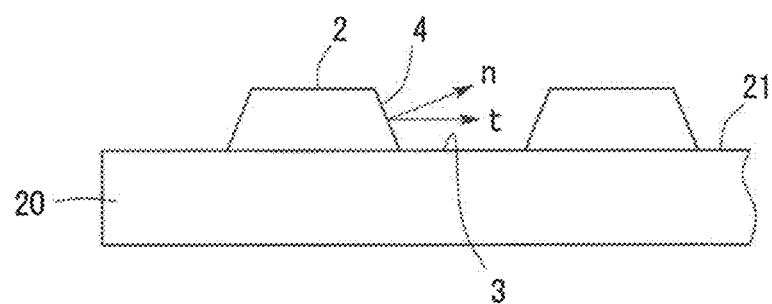
FIGS. 10A and 10B are graphical illustrations showing a relationship between a lateral vector obtained by orthogonally projecting a normal vector of the processed side surface to the main surface of the substrate and a projected vector obtained by orthogonally projecting a normal vector of sapphire a-plane to the main surface of the substrate.
Figure 10B:
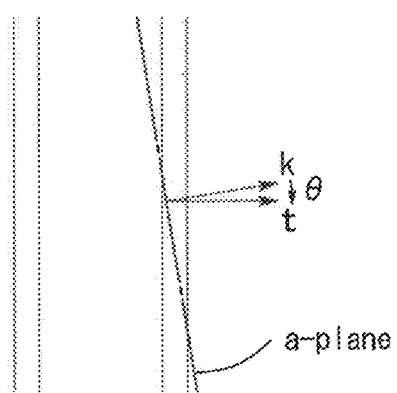

Subsequently, GaN was grown on the c-plane main surface of the sapphire substrate on which four mesa stripes were formed along the directions of 15.0°, 15.2°, 15.4°, 15.6° obtained by rotating the stripe direction in increments of 0.2° from the direction of 15° shown in FIG. 1. The SEM images of the surface of GaN grown to a thickness of 1 μm in these cases are shown in FIG. 7A. As shown in FIGS. 10A and 10B, an angle between the lateral vector t obtained by orthogonally projecting the normal vector n of the side surface 4 of the mesa 2 to the main surface 21 of the substrate 20 and the projected vector k obtained by orthogonally projecting the normal vector of the a-plane (11-20) of sapphire to the main surface 21 is defined as θ. As the direction angle θ on the main surface is rotated from the a-axis of the sapphire around the c-axis in increments of 0.2°, that is, the stripe direction of the mesa 2 is rotated from the m-axis of the sapphire around the c-axis in increments of 0.2°, a S plane (10-11) plane terrace and a step appear on the side surface of the growing GaN. The S plane (10-11) plane is an inclined m-plane in the c-axis direction and the step is an inclined a-plane in the c-axis direction. Its schematic illustration is shown in FIG. 7B.

Rotating the stripe direction of the mesa 2 is equivalent to rotating the surface perpendicular to the lateral vector t of the mesa from the a-plane of sapphire around the c-axis in increments of 0.2°.

Figure 6:
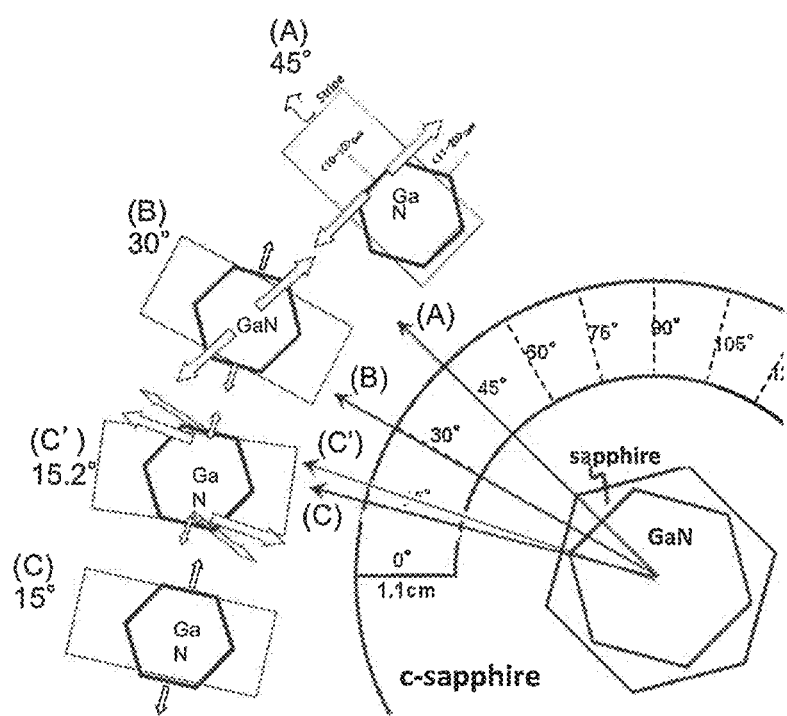
FIG. 6 is a graphical illustration showing a growth principle by the production method according to Embodiment 1.

A principle of GaN lateral growth will next be described with reference to FIG. 6. FIG. 6 shows the relationship between the mesa stripe direction and the crystal orientation of the growing GaN. In the direction of 15.0°, that is, when the mesa stripe direction is the m-axis of sapphire (the surface perpendicular to the lateral vector of the mesa is the a-plane of sapphire), the side surface of the mesa is parallel to the m-plane of GaN, and the a-axis vector of GaN does not have a component vertical to the side surface of the mesa. As the mesa stripe direction is rotated around the c-axis in increments of 0.2° from the direction of 15.0°, the side surface of the mesa will become less parallel to the m-plane of GaN. Thus, the a-axis vector of GaN has the component vertical to the side surface of the mesa, and the vertical component of the a-axis vector of GaN gradually increases. GaN growth is faster in the a-axis direction than in the m-axis direction. Therefore, as the above angle θ is increased, lateral growth is faster in a direction of the lateral vector. However, if the angle θ is excessively increased, GaN is not facet grown.

Figure 8:
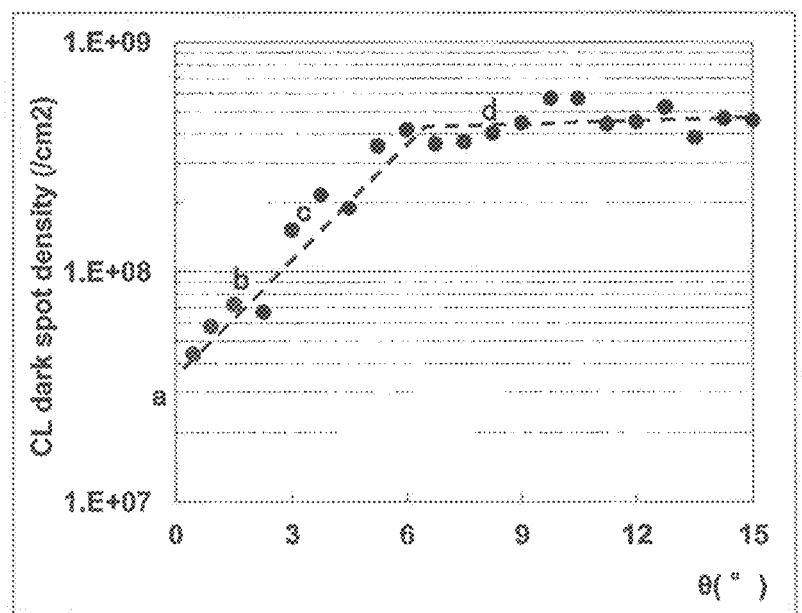
FIG. 8 is a graph showing a relationship between the CL dark spot density of GaN grown by the production method according to Embodiment 1 and the stripe direction angle of mesas.
Figure 9:
FIGS. 9A to 9D are cathodeluminescence images of the surface of GaN grown by the production method according to Embodiment 1.
Figure 9:
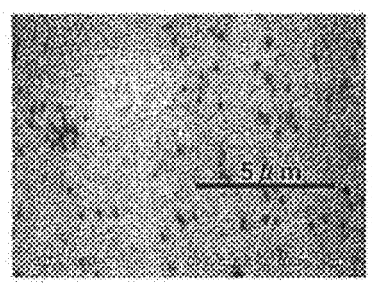
Figure 9:
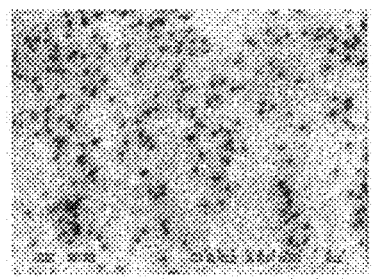
Figure 9:
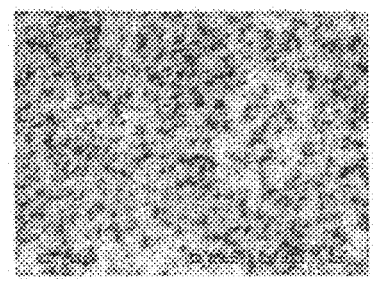

FIG. 8 shows the relationship between the angle θ and the dark spot density of cathodeluminescence images of GaN grown to a thickness of 5 μm when the angle between the lateral vector t obtained by orthogonally projecting the normal vector n of the side surface 4 of the mesa 2 to the main surface 21 of the substrate 20 and the projected vector k obtained by orthogonally projecting the normal vector of the a-plane (11-20) of sapphire to the main surface 21 shown in FIGS. 10A and 10B was varied. When the a-plane of sapphire is accurately perpendicular to the main surface 21, the normal vector of the a-plane completely coincides with the projected vector k of the normal vector on the main surface. Moreover, when the mesa stripe direction is in a direction of 15° to the baseline of the sapphire substrate as shown in FIG. 1, the angle θ is 0. When the angle θ is 0, the stripe direction is the m-axis of sapphire, and the angle θ is also an angle between the stripe direction of the mesa 2 and the m-axis. FIG. 9 shows the cathodeluminescence images. High dark spot density means that the threading dislocation density is high.

As shown in FIG. 8, when the angle θ is 0°, that is, the side surface 4 of the mesa 2 is the a-plane of sapphire (the lateral vector is the a-axis), GaN is facet grown, resulting in an extremely rough surface. When the angle θ falls within a range of 6° to 15°, the GaN surface is smooth, but the threading dislocation density is high. When the angle θ is 15°, the side surface of the mesa is an intermediate surface between the m-plane and the a-plane of sapphire (the lateral vector is in an intermediate direction between the m-axis and the a-axis). When the angle θ is 6°, the threading dislocation density is $4 \times 10^8/cm^2$. When the angle θ is reduced to 6° or less, the threading dislocation density is $4 \times 10^8/cm^2$ or less. When the angle θ is 0.5°, the threading dislocation density is reduced to $4.5 \times 10^7/cm^2$. Therefore, when GaN can be grown to bury a space among the facets and the threading dislocation density falls within a low range, the angle θ is preferably 0.5° or more, and 6° or less. When the angle θ exceeds 6°, facet growth of GaN is difficult.

Moreover, the threading dislocation density is $3.5 \times 10^8/cm^2$ when the angle θ is 5°, $1.7 \times 10^8/cm^2$ when the angle θ is 3°, $6.5 \times 10^7/cm^2$ when the angle θ is 2.5°, $7.5 \times 10^7/cm^2$ when the angle θ is 1.5°, $6 \times 10^7/cm^2$ when the angle θ is 1°. As is clear from FIG. 9, when the angle θ is 1.5°, 3°, and 7°, the surface is smooth. But, as the angle θ is increased, the threading dislocation density is increased. Therefore, to obtain GaN with a low threading dislocation density, the angle θ is preferably 0.5° or more and 6° or less. More preferably, the angle θ is 1° or more and 5° or less. Further preferably, the angle θ is 1° or more and 2.5° or less.

Quaternary, ternary, and binary Group III nitride semiconductor represented by other general formula AlGaInN have the same crystal structure as that of GaN. Therefore, the range of θ in the present invention, depending on the crystal orientation of the side surface of the mesa on the substrate, can also be applied to a general Group III nitride semiconductor.

Embodiment 2

Figure 2:
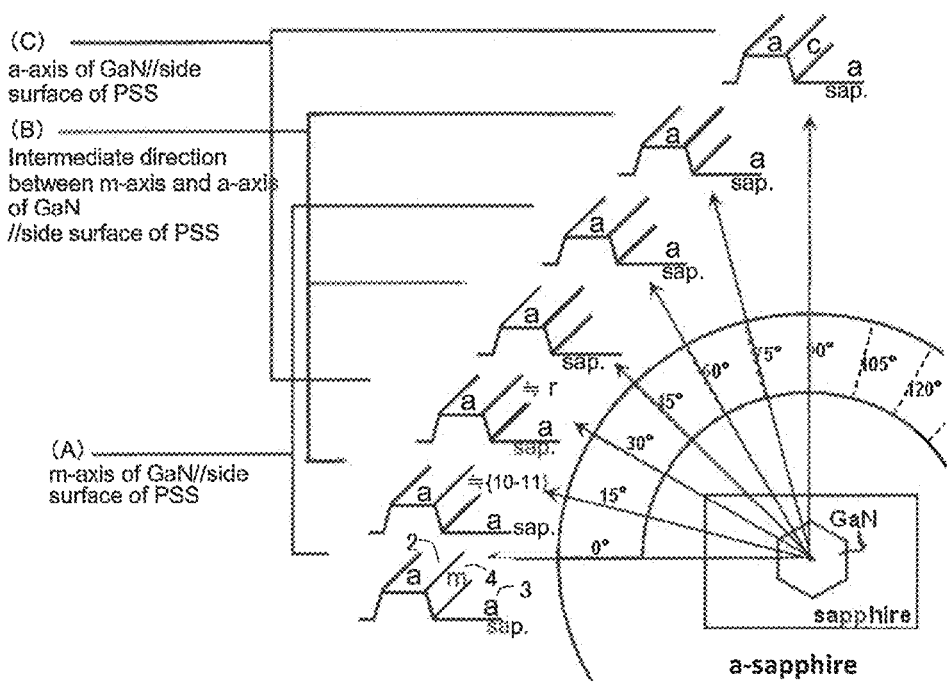
FIG. 2 is a graphical illustration showing a method for growing GaN by forming mesas and dents with their stripe direction sequentially and continuously changed on a sapphire substrate having an a-plane main surface in Embodiment 2.

Next will be described the case where GaN crystals were grown using a sapphire substrate having an a-plane main surface. In the present embodiment as well, the processed side surface is considered as perpendicular to the main surface of the substrate for ease of explanation. As shown in FIG. 2, mesas 2 and dents 3 were formed at an interval angle of 0.01° on the main surface of sapphire. In FIG. 2, when the stripe direction of the mesa 2 is in a direction of 0° to the baseline of the sapphire substrate, the side surface 4 of the mesa 2 is the m-plane of sapphire (the lateral vector is the m-axis). When the stripe direction of the mesa 2 is in a direction of 90° to the baseline of the sapphire substrate, the side surface 4 of the mesa 2 is the c-plane of sapphire (the lateral vector is the c-axis). The stripe direction is in an intermediate direction of 30° between 0° and 90°, the side surface 4 of the mesa 2 is a plane close to the r-plane (−1012) of sapphire (the lateral vector is the r-axis), but the plane perpendicular to the lateral vector of the side surface 4 of the mesa 2 in other directions is the plane obtained by rotating the m-plane around the a-axis.

Figure 3B:
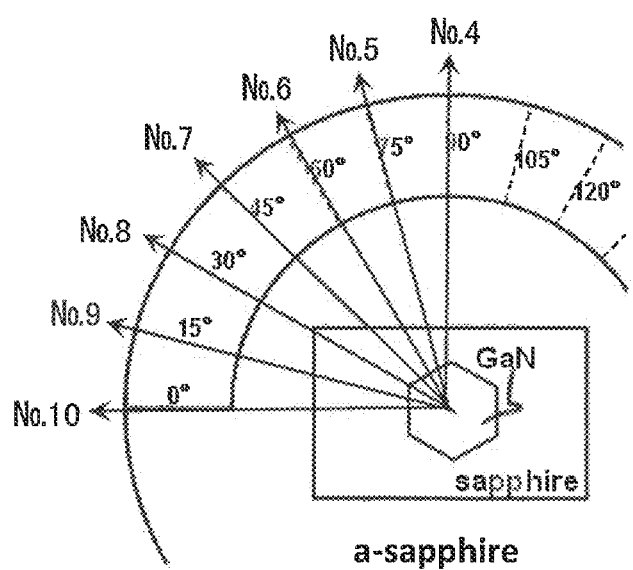
FIG. 3B is a graphical illustration showing a relationship between the stripe direction and the sample in Embodiment 2.

FIG. 4 shows the SEM images of the cross sections perpendicular to the stripe direction at an initial stage of GaN growth when the mesa stripe directions shown in FIG. 3B are No. 4 (the side surface of the mesa is the c-plane) to No. 10 (the side surface of the mesa is the m-plane). FIG. 5 shows the SEM images of the cross sections perpendicular to the stripe direction when GaN was grown to a thickness of 5 μm.

In the case of No. 4, that is, when the side surface 4 of the mesa 2 is the c-plane of sapphire (the lateral vector is the c-axis), GaN is laterally grown on the side surface 4 and GaN is facet grown on the top surface of the mesa 2 and the bottom surface of the dent 3 so that the cross section perpendicular to the stripe direction is triangle-shaped. When the stripe direction of the mesa 2 is 30°, that is, when the side surface 4 of the mesa 2 is a plane close to the r-plane (−1012) (the lateral vector is the r-axis), GaN is facet grown on the top surface of the mesa 2, but GaN is evenly and vertically grown on the bottom surface of the dent 3. In the case of other directions, there is no dominant lateral growth of GaN on the side surface 4 of the mesa 2, and no GaN facet growth is observed.

As is clear from FIG. 5, when the stripe direction is No. 4, that is, the side surface 4 of the mesa 2 is the c-plane of sapphire (the lateral vector is the c-axis), GaN is facet grown so that the cross section perpendicular to the stripe direction is triangle-shaped, and a space among the facets is not buried with GaN. Moreover, in the case of No. 5 to No. 10, no GaN facet growth is observed, and the threading dislocation density extending in a vertical direction is high. However, the GaN surface is flat.

From the above, when the mesas 2 and the dents 3 were formed on the sapphire substrate having an a-plane main surface, in the case where the side surface 4 of the mesa 2 is the c-plane of sapphire (the lateral vector is the c-axis), the plane of the growing GaN which is perpendicular to the lateral vector of the side surface 4 of the mesa 2 is the m-plane of GaN. Therefore, GaN is fact grown on the top surfaces of the mesas and the bottom surfaces of the dents, and a space among the facets are not buried with GaN. This is the same as when the side surface of the mesa is the a-plane of sapphire in GaN growth on a c-plane main surface of the sapphire substrate. Therefore, as in Embodiment 1, when an angle between the lateral vector obtained by orthogonally projecting the normal vector of the processed side surface to the main surface of the substrate and the projected vector obtained by orthogonally projecting the normal vector of sapphire c-plane (0001) to the main surface of the substrate falls within a range of 0.5° to 6°, the threading dislocation density can be reduced and the surface of the grown GaN can be smooth. Such varying the angle θ in the range of 0.5° to 6° is equivalent to that a plane obtained by rotating the c-plane in a range of 0.5° to 6° around the a-axis, when the side surface of the mesa is completely perpendicular to the main surface of the substrate, is considered as the side surface of the mesa. In case of using a sapphire substrate having an a-plane main surface, the present invention can also be applied to a general Group III nitride semiconductor, as in Embodiment 1.

Embodiment 3

Figure 11:
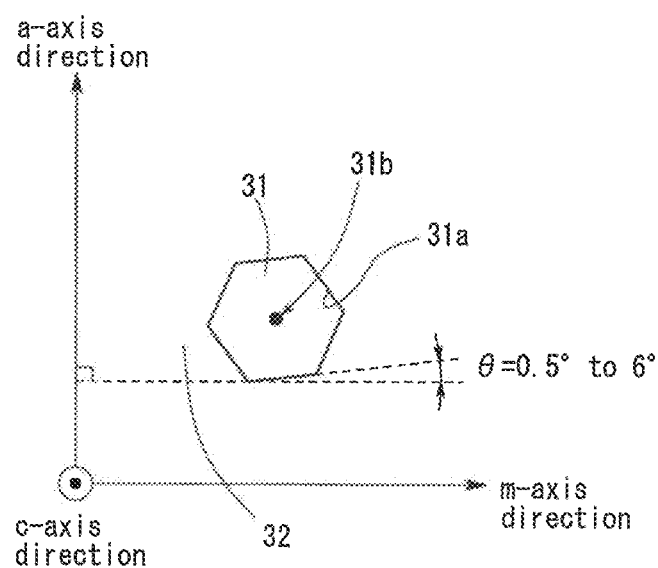
FIG. 11 is a graphical illustration showing a relationship between the side surface of the mesa formed on the main surface of the sapphire substrate having a c-plane main surface and the crystal orientation in Embodiment 3.
Figure 12:
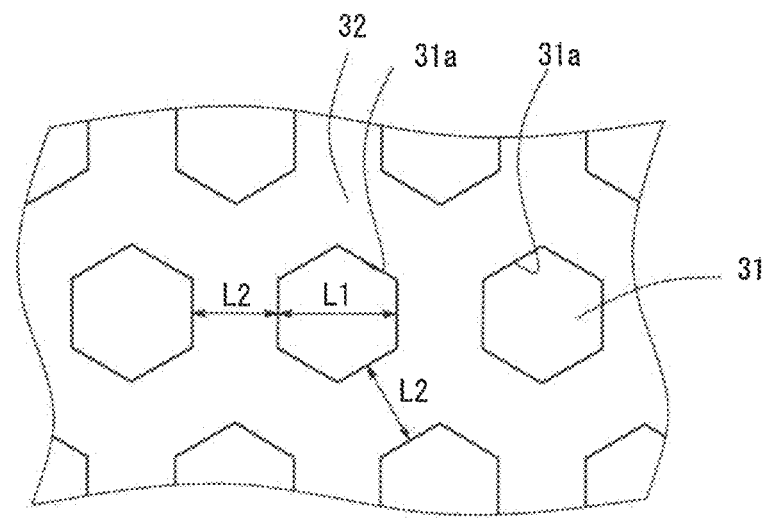
FIG. 12 is a plan view of the main surface of the sapphire substrate showing the arrangement of the mesas in Embodiment 3.

This embodiment describes the case where island-like mesas were formed. As shown in FIG. 11, a concavo-convex shape in which mesas 31 being a plurality of regular hexagonal prisms are arranged in a honeycomb pattern was formed by dry etching on a surface of a sapphire substrate having a c-plane main surface. The sapphire substrate having a thickness of 500 μm is used, and the etching depth (in other words, the height of mesa 31) is 0.7 FIG. 12 is a plan view of the concavo-convex shape as viewed from above. The top surfaces of the mesas 31 (regular hexagon in FIG. 12) are the surface (main surface) of the sapphire substrate remained without being etched, and the area exposed by etching among the mesas 31 is a flat surface parallel to the surface of the sapphire substrate. This flat surface forms the bottom surfaces of dents 32. The top surfaces of the mesas 31 and the bottom surfaces of the dents 32 are both the c-plane of sapphire. An interval L1 between two opposing side surfaces 31a of any one of mesas 31 is 3 μm, and an interval L2 between adjacent mesas 31 is 2 μm. The side surfaces 31a of each mesa 31 being a regular hexagonal prism are a plane perpendicular to the c-plane of sapphire, which is obtained by rotating the a-plane of sapphire (the lateral vector is the a-axis) within a range of 0.5° to 6° around a c-axis 31b. In FIG. 11, a perpendicular direction from the back to the front of the paper is a +c-axis direction.

Subsequently, sputtering was performed at a substrate temperature of 500° C. using high-purity aluminum and nitrogen as raw materials in a magnetron sputter system, thereby forming an AlN buffer layer having a thickness of 10 nm to 30 nm on the c-plane of the sapphire substrate on the side where the concavo-convex shape was formed.

Next, on the surface of the sapphire substrate on which the concave-convex shape was formed, a GaN layer having a c-plane main surface was grown via the buffer layer to a thickness of 5 μm on the top surfaces of the mesas 31 and the bottom surfaces of the dents 32 by MOCVD. The raw material gases employed for MOCVD are as follows: TMG (trimethylgallium) as a Ga source, ammonia as a nitrogen source, and hydrogen or nitrogen as a carrier gas.

In this case, the m-plane of the growing GaN is parallel to the a-plane of sapphire. Since an angle θ between the lateral vector of the processed side surface of the sapphire substrate and the a-axis is 0.5° or more and 6° or less, a plane of the growing GaN, which is parallel to the side surface 31*a* of mesa 31 (a plane perpendicular to the lateral vector), is a plane obtained by rotating the m-plane of the growing GaN within a range of 0.5° to 6° around the c-axis. As a result, the normal vector of the a-plane of GaN has a component in a direction of the lateral vector of the mesa 31. Therefore, GaN is grown in a direction parallel to the main surface in addition to facet growth, thereby growing so as to cover a space among the facets. Thus, flat and smooth GaN with low threading dislocation density on its surface can be obtained.

Embodiment 4

Figure 13:
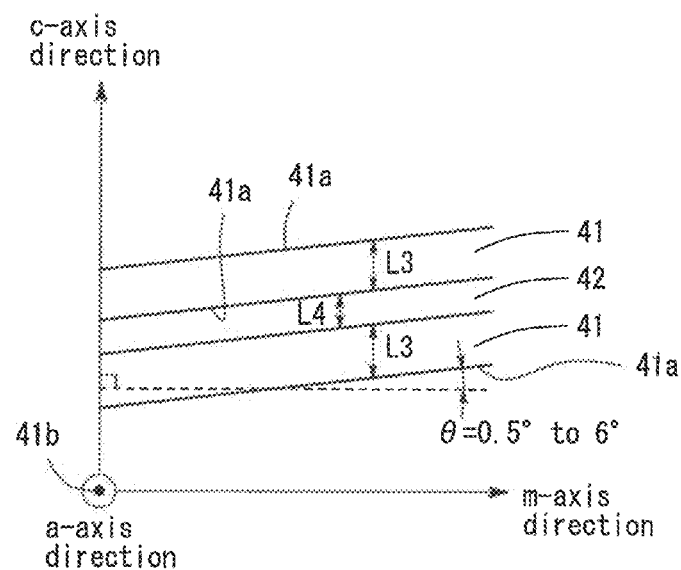
FIG. 13 shows a graphical illustration showing a relationship between the side surfaces of the mesas on the sapphire substrate having an a-plane main surface and the crystal orientation in Embodiment 4.
Figure 14:
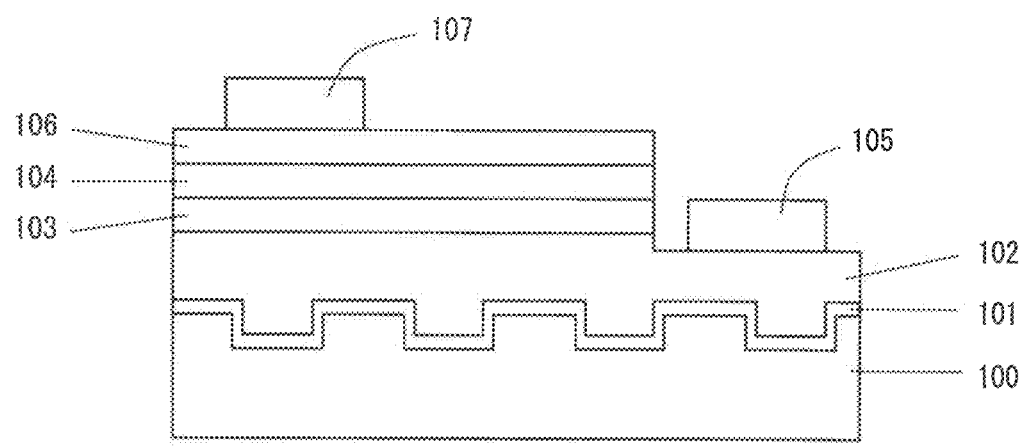
FIG. 14 is a cross-sectional view showing the structure of a light-emitting device according to Embodiment 5.

As shown in FIG. 13, this embodiment describes the case where a plurality of mesas was formed in a parallel stripe pattern. On a surface of a sapphire substrate having an a-plane main surface, a concavo-convex shape in which a plurality of stripe mesas 41 were periodically and repeatedly arranged was formed by dry etching. A sapphire substrate having a thickness of 500 μm is used, and the etching depth (in other words, the height of the mesa 41) is 0.7 μm. FIG. 13 is a plan view of the concavo-convex shape as viewed from above. The top surfaces of the mesas 41 are the surface of the sapphire substrate remained without being etched, and the area exposed by etching among the mesas 41 is a flat surface parallel to the surface of the sapphire substrate. This flat surface forms the bottom surfaces of dents 42. The top surfaces of the mesas 41 and the bottom surfaces of the dents 42 are both the a-plane of sapphire. An interval L3 between two opposing side surfaces 41*a* of any one of mesas 41 (the width of each mesa 41) is 3 μm, and a width L4 of each dent 42 is 2 μm. The side surfaces 41*a* of each stripe mesa 41 are a plane perpendicular to the a-plane of sapphire, which is obtained by rotating the c-plane of sapphire (the lateral vector is the c-axis) within a range of 0.5° to 6° around an a-axis 41*b*.

Subsequently, as in Embodiment 3, sputtering was performed at a substrate temperature of 500° C. using high-purity aluminum and nitrogen as raw materials in a magnetron sputter system, thereby forming an AlN buffer layer having a thickness of 10 nm to 30 nm on the a-plane of the sapphire substrate on which the concave-convex shape was formed.

Next, on the surface of the sapphire substrate on which the concave-convex shape was formed, as in Embodiment 3, a GaN layer having a c-plane main surface was grown via the buffer layer to a thickness of 5 μm on the top surfaces of the mesas 41 and the bottom surfaces of the dents 42 by MOCVD.

In this case, the m-plane of the growing GaN is parallel to the c-plane of sapphire. Since an angle θ between the lateral vector of the processed side surface and the c-axis is 0.5° or more and 6° or less, a plane parallel to the side surface 41*a* of the mesa 41 (a plane perpendicular to the lateral vector) is the plane which is obtained by rotating the m-plane of the growing GaN within a range of 0.5° to 6° around the c-axis. As a result, the normal vector of the a-plane of GaN has a component in a direction of the lateral vector of the mesa 41. Therefore, GaN is grown in a direction parallel to the main surface in addition to facet growth, thereby growing so as to cover a space among the facets. Thus, flat and smooth GaN with low threading dislocation density on its surface can be obtained.

Embodiment 5

Embodiment 5 is an example where a light emitting device of Group III nitride semiconductor was formed by sequentially depositing semiconductor layers on GaN formed in Embodiments 3 and 4. An n-type layer 102, a light-emitting layer 103, and a p-type layer 104, each of the layers being formed of Group III nitride semiconductor, were sequentially deposited by MOCVD via an buffer layer 101 on the mesa-formed sapphire substrate 100 as in Embodiments 3 and 4. Subsequently, a portion of the p-type layer 104 and the light-emitting layer 103 was removed by dry etching, to thereby expose the n-type layer 102. An n-electrode 105 was formed on the exposed n-type layer 102, and an ITO transparent electrode 106 was formed on the entire top surface of the p-type layer 104, and a p-electrode 107 was formed on the transparent electrode 106, thereby producing a light-emitting device.

In this method for producing a light-emitting device, the n-type layer 102, the light-emitting layer 103 and the p-type layer 104 are formed by the same production method as the GaN layer production method in Embodiments 3 and 4. Therefore, crystallinity and flatness can be improved by reducing the threading dislocation density of the n-type layer 102, the light-emitting layer 103 and the p-type layer 104, thereby improving the internal quantum efficiency. Moreover, light extraction performance can also be improved since the concave-convex shape is formed on the sapphire substrate 100. Thus, the light output of the light emitting device can be improved.

Embodiment 6

Figure 15:
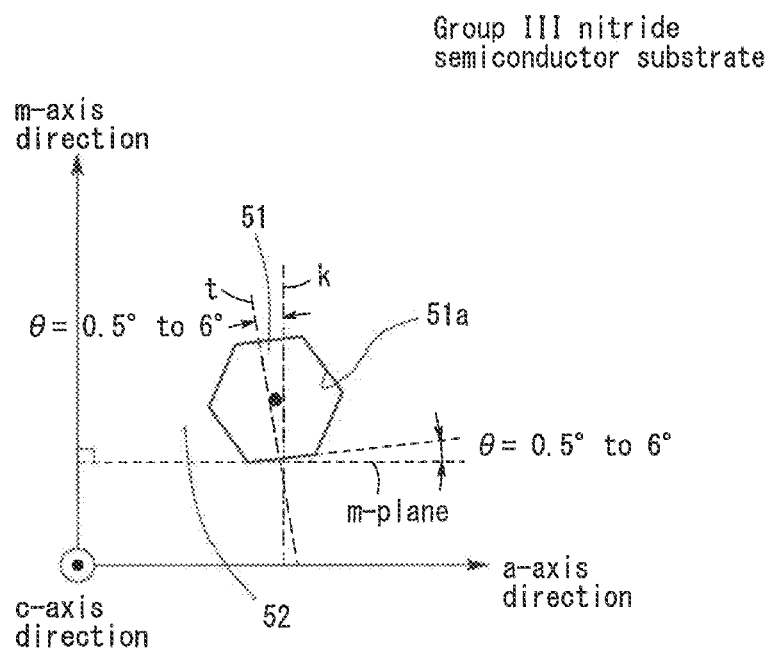
FIG. 15 is a graphical illustration showing a relationship between the side surface of the mesa formed on the main surface of the Group III nitride semiconductor substrate having a c-plane main surface and the crystal orientation in Embodiment 6.
Figure 16:
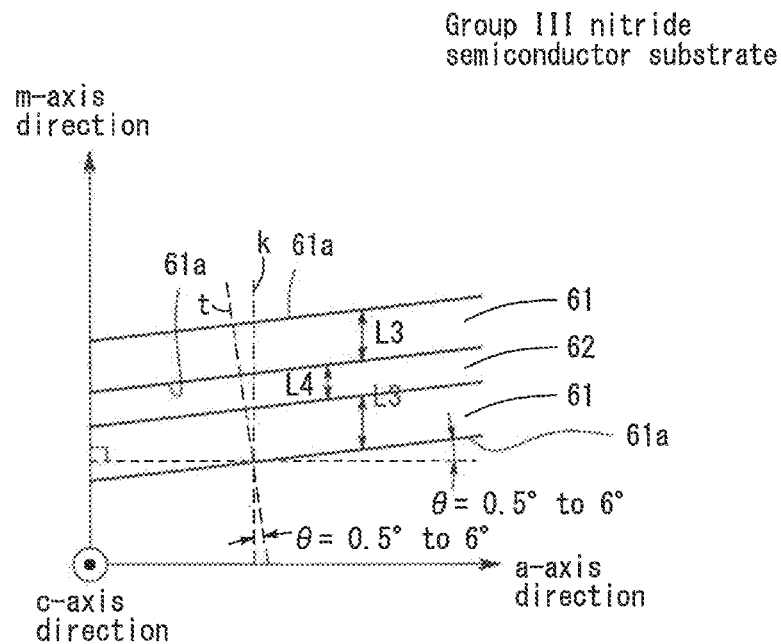
FIG. 16 shows a graphical illustration showing a relationship between the side surfaces of the mesas on the Group III nitride semiconductor substrate having a c-plane main surface and the crystal orientation in Embodiment 6.

This embodiment is an example using a Group III nitride semiconductor substrate instead of a sapphire substrate in Embodiment 3 and 4. In this case, as shown in FIGS. 15 and 16, the main surface of the substrate is a c-plane. Mesas 51, 61 were formed so that an angle θ between a lateral vector t of the processed side surface 51*a*, 61*a* and a projected vector k obtained by orthogonally projecting a normal vector of the m-plane to the main surface of the substrate is 0.5° or more and 6° or less. The mesa 51 may be a hexagon of Embodiment 3 as shown in FIG. 15. The mesa 56 may be a strip of Embodiment 4 as shown in FIG. 16. In this case, the Group III nitride semiconductor substrate is grown in a c-axis direction on the top surfaces of the mesas 51, 61 and the bottom surfaces of the dents 52, 62. The m-plane of the substrate is parallel to the m-plane of the growing Group III nitride semiconductor. In this case, the normal vector of the a-plane of the growing Group III nitride semiconductor has a component in a direction of the lateral vector t, and thus Group III nitride semiconductor is grown laterally as well as vertically. Therefore, under the vertical growth conditions, Group III nitride semiconductor can cover a space among the facets while facet growing. The present invention can also be practiced by using a template substrate in which a GaN or other Group III nitride semiconductor layer was epitaxially grown on the sapphire substrate and forming mesas on the Group III nitride semiconductor layer. Moreover, the present invention can be practiced by using a template substrate in which a GaN or other Group III nitride semiconductor layer was epitaxially grown on an AlN substrate.

In Embodiment 3, the concavo-convex shape has a structure wherein the hexagonal prism shaped mesas are arranged in a honeycomb pattern. However, the concave-convex shape may have any structure, for example, wherein the dents or the mesas such as regular hexagon, regular triangle, and square are periodically arranged in a dot pattern, a stripe pattern or a lattice pattern for the sapphire substrate having a c-plane main surface. Particularly preferably is the structure wherein a plurality of dents or mesas is periodically arranged at regular intervals. The dents or mesas particularly preferably have a shape of regular hexagonal prism or regular hexagonal truncated pyramid. This is because light extraction performance can be further improved when the present invention is applied to the production of light-emitting device.

In Embodiments 1 to 6, the buffer layer is formed of AlN, but it is not limited to this, and it may be formed of $Al_xGa_yN$ (x+y=1, 0≤x, y≤1). The buffer layer may be a single layer or may comprise a plurality of layers. In Embodiments 3 to 5, the buffer layer is formed by the sputtering method, but the buffer layer may be formed by MOCVD.

The present invention can be applied to the method for producing a Group III nitride semiconductor light-emitting device.

What is claimed is:

1. A method for producing a Group III nitride semiconductor comprising:
    forming mesas and dents on a main surface of a substrate by processing the substrate, the mesas and dents being made of material of the substrate as one body; and
    growing Group III nitride semiconductor in a c-axis direction of the Group III nitride semiconductor on the top surfaces of the mesas and the bottom surfaces of the dents, wherein
    the substrate consists of one member selected from a group consisting of sapphire, SiC, Si and ZnO, and
    side surfaces of the mesas and the dents are formed so as to satisfy the following conditions:
        a plane, which is most parallel to the side surfaces among low-index planes of the growing Group III nitride semiconductor, is a m-plane (1-100); and
        when a projected vector obtained by orthogonally projecting a normal vector of the side surface to the main surface is defined as a lateral vector, an angle formed by the lateral vector and a projected vector obtained by orthogonally projecting a normal vector of the m-plane of the growing Group III nitride semiconductor to the main surface is 0.5° or more and 6° or less.

2. A method for producing a Group III nitride semiconductor comprising:
    forming mesas and dents on a main surface of a substrate by processing the substrate, the mesas and dents being made of material of the substrate as one body; and
    growing Group III nitride semiconductor in a c-axis direction of the Group III nitride semiconductor on the top surfaces of the mesas and the bottom surfaces of the dents, wherein the substrate comprises a hexagonal crystal structure comprising different material from the Group III nitride semiconductor,
    the main surface of the substrate is a c-plane (0001) of hexagonal crystal, and
    side surfaces of the mesas and the dents are formed so as to satisfy the following conditions:
        a plane, which is most parallel to the side surfaces among low-index planes of the growing Group III nitride semiconductor, is a m-plane (1-100); and
        when a projected vector obtained by orthogonally projecting a normal vector of the side surface to the main surface is defined as a lateral vector, an angle formed by the lateral vector and a projected vector obtained by orthogonally projecting a normal vector of an a-plane (11-20) of the hexagonal crystal structure of the substrate to the main surface is 0.5° or more, and 6° or less.

3. A method for producing a Group III nitride semiconductor comprising:
    forming mesas and dents on a main surface of a substrate by processing the substrate, the mesas and dents being made of material of the substrate as one body; and
    growing Group III nitride semiconductor in a c-axis direction of the Group III nitride semiconductor on the top surfaces of the mesas and the bottom surfaces of the dents, wherein
    the substrate comprises a hexagonal crystal structure comprising different material from the Group III nitride semiconductor,
    the main surface of the substrate is an a-plane (11-20) of hexagonal crystal, and
    side surfaces of the mesas and the dents are formed so as to satisfy the following conditions:
        a plane, which is most parallel to the side surfaces among low-index planes of the growing Group III nitride semiconductor, is a m-plane (1-100); and
        when a projected vector obtained by orthogonally projecting a normal vector of the side surface to the main surface is defined as a lateral vector, an angle formed by the lateral vector and a projected vector obtained by orthogonally projecting a normal vector of a c-plane (0001) of the hexagonal crystal structure of the substrate to the main surface is 0.5° or more, and 6° or less.

4. A method for producing a Group III nitride semiconductor comprising:
    forming mesas and dents on a main surface of a substrate by etching the substrate, the mesas and dents being made of material of the substrate as one body; and
    growing Group III nitride semiconductor in a c-axis direction of the Group III nitride semiconductor on the top surfaces of the mesas and the bottom surfaces of the dents, wherein
    at least a portion on which the mesas and the dents are formed on the main surface of the substrate comprises a Group III nitride semiconductor,
    the main surface of the substrate is a c-plane (0001) of the Group III nitride semiconductor, and
    side surfaces of the mesas and the dents are formed so as to satisfy the following conditions:
        a plane, which is most parallel to the side surfaces among low-index planes of the growing Group III nitride semiconductor, is a m-plane (1-100); and
        when a projected vector obtained by orthogonally projecting a normal vector of the side surface to the main surface is defined as a lateral vector, an angle formed by the lateral vector and a projected vector obtained by orthogonally projecting a normal vector of a m-plane (1-100) of the Group III nitride semiconductor of the substrate to the main surface is 0.5° or more, and 6° or less, and
    wherein the growing of the Group III nitride semiconductor comprises facet growing the Group III nitride semiconductor on the substrate on the top surface of the mesa and the bottom surface of the dent and burying a space among the facets.

5. A method for producing a Group III nitride semiconductor according to claim 2, wherein the substrate comprises a sapphire substrate.

6. A method for producing a Group III nitride semiconductor according to claim 3, wherein the substrate comprises a sapphire substrate.

7. A method for producing a Group III nitride semiconductor according to claim 1, wherein the mesas or the dents are formed in a periodic structure where a stripe extending in a first direction is repeated in a second direction perpendicular to the first direction on the main surface.

8. A method for producing a Group III nitride semiconductor according to claim 2, wherein the mesas or the dents are formed in a periodic structure where a stripe extending in a first direction is repeated in a second direction perpendicular to the first direction on the main surface.

9. A method for producing a Group III nitride semiconductor according to claim 3, wherein the mesas or the dents are formed in a periodic structure where a stripe extending in a first direction is repeated in a second direction perpendicular to the first direction on the main surface.

10. A method for producing a Group III nitride semiconductor according to claim 1, wherein the mesa or the dent has a shape selected from a group consisting of regular triangular prism, rhombic prism, regular hexagonal prism, regular triangular pyramid, rhombic pyramid, and regular hexagonal pyramid, and a plurality of dents or mesas are arranged in a honeycomb pattern at regular intervals.

11. A method for producing a Group III nitride semiconductor according to claim 1, wherein the angle is 1° or more and 5° or less.

12. A method for producing a Group III nitride semiconductor according to claim 1, wherein the angle is 1° or more and 2.5° or less.

13. A method for producing a Group III nitride semiconductor according to claim 1, wherein a buffer layer is formed on the substrate having the mesas and the dents thereon, and thereafter, the Group III nitride semiconductor is grown.

14. A method for producing a Group III nitride semiconductor according to claim 13, wherein the buffer layer is formed by a sputtering method.

15. A Group III nitride semiconductor having a substrate with mesas and dents formed on a main surface thereof by processing the substrate, and grown on the top surfaces of the mesas and the bottom surfaces of the dents in a c-axis direction of the Group III nitride semiconductor, the mesas and dents being made of material of the substrate as one body, wherein
the substrate consists of one member selected from a group consisting of sapphire, SiC, Si and ZnO,
side surfaces of the mesas and the dents are formed so as to satisfy the following conditions:
a plane, which is most parallel to the side surfaces among low-index planes of the growing Group III nitride semiconductor, is a m-plane (1-100); and
when a projected vector obtained by orthogonally projecting a normal vector of the side surface to the main surface is defined as a lateral vector, an angle formed by the lateral vector and a projected vector obtained by orthogonally projecting a normal vector of the m-plane of the growing Group III nitride semiconductor to the main surface is 0.5° or more and 6° or less.

16. A Group III nitride semiconductor having a substrate with mesas and dents formed on a main surface thereof by processing the substrate, the mesas and dents being made of material of the substrate as one body, and grown on the top surfaces of the mesas and the bottom surfaces of the dents in a c-axis direction of the Group III nitride semiconductor, wherein,
the substrate comprises a hexagonal crystal substrate comprising different material from the Group III nitride semiconductor,
the main surface of the substrate is a c-plane (0001) of hexagonal crystal, and
side surfaces of the mesas and the dents are formed so as to satisfy the following conditions:
a plane, which is most parallel to the side surfaces among low-index planes of the growing Group III nitride semiconductor, is a m-plane (1-100); and
when a projected vector obtained by orthogonally projecting a normal vector of the side surface to the main surface is defined as a lateral vector, an angle formed by the lateral vector and a projected vector obtained by orthogonally projecting a normal vector of an a-plane (11-20) of the hexagonal crystal structure of the substrate to the main surface is 0.5° or more, and 6° or less.

17. A Group III nitride semiconductor having a substrate with mesas and dents formed on a main surface thereof by processing the substrate, the mesas and dents being made of material of the substrate as one body, and grown on the top surfaces of the mesas and the bottom surfaces of the dents in a c-axis direction of the Group III nitride semiconductor, wherein,
the substrate comprises a hexagonal crystal substrate comprising different material from the Group III nitride semiconductor,
a main surface of the substrate is an a-plane (11-20) of hexagonal crystal, and
side surfaces of the mesas and the dents are formed so as to satisfy the following conditions:
a plane, which is most parallel to the side surfaces among low-index planes of the growing Group III nitride semiconductor, is a m-plane (1-100); and
when a projected vector obtained by orthogonally projecting a normal vector of the side surface to the main surface is defined as a lateral vector, an angle formed by the lateral vector and a projected vector obtained by orthogonally projecting a normal vector of a c-plane (0001) of the hexagonal crystal structure of the substrate to the main surface is 0.5° or more, and 6° or less.

18. A Group III nitride semiconductor having a substrate with mesas and dents formed on a main surface thereof by etching the substrate, the mesas and dents being made of material of the substrate as one body, and grown on the top surfaces of the mesas and the bottom surfaces of the dents in a c-axis direction of the Group III nitride semiconductor, wherein
at least a portion on which the mesas and the dents are formed on the main surface of the substrate comprises a Group III nitride semiconductor,
the main surface of the substrate is a c-plane (0001) of the Group III nitride semiconductor of the substrate, and
side surfaces of the mesas and the dents are formed so as to satisfy the following conditions:
a plane, which is most parallel to the side surfaces among low-index planes of the growing Group III nitride semiconductor, is a m-plane (1-100); and
when a projected vector obtained by orthogonally projecting a normal vector of the side surface to the main surface is defined as a lateral vector, an angle formed by the lateral vector and a projected vector obtained by orthogonally projecting a normal vector of a m-plane (1-100) of the Group III nitride semiconductor of the substrate to the main surface is 0.5° or more, and wherein the Group III nitride semiconductor on the substrate comprises facet parts facet grown on the top surface of the mesa and the bottom surface of the dent and buried parts in a space among the facets.

19. A Group III nitride semiconductor according to claim 15, wherein the substrate comprises a sapphire substrate.

20. A Group III nitride semiconductor according to claim 15, wherein the mesas or the dents are formed in a periodic structure where a stripe extending in a first direction is repeated in a second direction perpendicular to the first direction on the main surface.

21. A Group III nitride semiconductor according to claim 15, wherein the dent or the mesa has a shape selected from a group consisting of regular triangular prism, rhombic prism, regular hexagonal prism, regular triangular pyramid, rhombic pyramid, and regular hexagonal pyramid, and a plurality of dents or mesas are arranged in a honeycomb pattern at regular intervals.

22. A Group III nitride semiconductor according to claim 15, wherein the angle is 1° or more and 5° or less.

23. A Group III nitride semiconductor according to claim 15, wherein the angle is 1° or more and 2.5° or less.

24. A light-emitting device comprising:
the Group III nitride semiconductor according to claim 15.

25. A Group III nitride semiconductor according to claim 16, wherein the substrate comprises a sapphire substrate.

26. A Group III nitride semiconductor according to claim 17, wherein the substrate comprises a sapphire substrate.

27. A Group III nitride semiconductor according to claim 16, wherein the mesas or the dents are formed in a periodic structure where a stripe extending in a first direction is repeated in a second direction perpendicular to the first direction on the main surface.

28. A Group III nitride semiconductor according to claim 17, wherein the mesas or the dents are formed in a periodic structure where a stripe extending in a first direction is repeated in a second direction perpendicular to the first direction on the main surface.

29. A Group III nitride semiconductor according to claim 18, wherein the mesas or the dents are formed in a periodic structure where a stripe extending in a first direction is repeated in a second direction perpendicular to the first direction on the main surface.

30. A Group III nitride semiconductor according to claim 16, wherein the dent or the mesa includes a shape selected from a group consisting of regular triangular prism, rhombic prism, regular hexagonal prism, regular triangular pyramid, rhombic pyramid, and regular hexagonal pyramid, and a plurality of dents or mesas are arranged in a honeycomb pattern at regular intervals.

31. A Group III nitride semiconductor according to claim 17, wherein the dent or the mesa includes a shape selected from a group consisting of regular triangular prism, rhombic prism, regular hexagonal prism, regular triangular pyramid, rhombic pyramid, and regular hexagonal pyramid, and a plurality of dents or mesas are arranged in a honeycomb pattern at regular intervals.

32. A Group III nitride semiconductor according to claim 18, wherein the dent or the mesa includes a shape selected from a group consisting of regular triangular prism, rhombic prism, regular hexagonal prism, regular triangular pyramid, rhombic pyramid, and regular hexagonal pyramid, and a plurality of dents or mesas are arranged in a honeycomb pattern at regular intervals.

33. A Group III nitride semiconductor according to claim 16, wherein the angle is 1° or more and 5° or less.

34. A Group III nitride semiconductor according to claim 17, wherein the angle is 1° or more and 5° or less.

* * * * *